(12) United States Patent
Fransis et al.

(10) Patent No.: US 6,271,726 B1
(45) Date of Patent: Aug. 7, 2001

(54) WIDEBAND, VARIABLE GAIN AMPLIFIER

(75) Inventors: Bert L. Fransis; John Francis O'Connor, both of San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/480,831

(22) Filed: Jan. 10, 2000

(51) Int. Cl.$^7$ ................................................. H03F 3/45
(52) U.S. Cl. ........................... 330/254; 330/279; 330/285
(58) Field of Search ................................. 330/254, 279, 330/283, 284, 285

(56) References Cited

U.S. PATENT DOCUMENTS

| | | | |
|---|---|---|---|
| 3,875,522 | * 4/1975 | Hoefi | 330/30 D |
| 4,396,891 | * 8/1983 | Johansson et al. | 330/254 |
| 5,313,172 | * 5/1994 | Vagher | 330/254 |
| 5,459,433 | * 10/1995 | Fenk et al. | 330/254 |
| 5,999,056 | * 12/1999 | Fong | 330/278 |
| 6,049,252 | * 4/2000 | Iwata | 330/254 |

OTHER PUBLICATIONS

Brett et al., A Direct Conversion L–Band Tuner for Digital DBS, IEEE International Solid–State Circuits Conference, 1998, 2 pp.
Sahota et al., High Dynamic Range Variable–Gain Amplifier for CDMA Wireless Applications, IEEE International Solid–State Circuits Conference, 1997, 4 pp.
van Lieshout et al., A Monolithic Wideband Variable Gain Amplifier with a High Gain Range and Low Distortion, IEEE International Solid–State Circuits Conference, 1997, 3 pp.

* cited by examiner

Primary Examiner—Robert Pascal
Assistant Examiner—Henry Choe
(74) Attorney, Agent, or Firm—Akin, Gump, Strauss, Hauer & Feld, LLP; Gregory K. Goshorn

(57) ABSTRACT

An amplifier circuit including a novel degeneration input stage that permits a low Noise Figure and superior linearity to be achieved in combination. The amplifier is suitable for use in fully integrated direct-conversion tuner circuits, and provides continuously variable gain functionality implemented by steering current away from an output load of the amplifier through differential transistor pairs located in the current signal paths of an input stage. Voltage headroom problems are avoided by placing the attenuation resistors of the degenerated input stage in the signal path, such that there is little or no DC voltage drop across the resistors. Further, this arrangement permits very accurate on-chip matching to an off-chip signal source. The distribution of IP3 values over the gain range of the amplifier, as well as gain and NF characteristics, are dependent on resistor ratios rather than absolute values. These amplifier characteristics are thus largely temperature and process independent. In one embodiment of the invention, separate voltage supplies, ground connections and bias circuits are provided for different portions of the circuitry in order to improve noise immunity and reduce coupling of an input signal to the output of the amplifier circuit.

20 Claims, 5 Drawing Sheets

AMPLIFIER INPUT INTERCEPT CHARACTERISTICS

WIDEBAND, VARIABLE GAIN AMPLIFIER

FIELD OF THE INVENTION

The present invention relates generally to broadband communications; and, more particularly, it relates to a differential, variable-gain, low-noise amplifier capable of functioning in direct-conversion applications.

BACKGROUND OF THE INVENTION

Amplifiers find many uses in communication systems. For example, high performance amplifiers are integral components of consumer products such as tuners for digital direct broadcast satellite (DBS) applications. In particular, high performance amplifiers are required in direct-conversion tuner products designed for use in DBS and other applications. Direct-conversion architectures reduce the required amount of off-chip componentry and overall system costs as compared to intermediate-frequency (IF) solutions.

Complicating the design of communications systems is the fact that the amplitude of signals reaching a receiver can vary dramatically for a number of reasons, particularly on channels that utilize RF propagation. Satellite signals, for example, can be affected by weather, clouds and rain. Similarly, wireless network signals may be affected by distance and fading.

In this context, automatic gain control (AGC) functionality is often employed to develop a constant power level for use by subsequent stages of the communication system. It is beneficial to provide a known signal level via gain adjustments in order to economically and reliably design processing stages that operate near optimum drive and output levels. Typically, optimal levels are determined by the relationship of signal level to noise or distortion limits. However, AGC circuitry, particularly of wide dynamic range, may have deleterious effects on the noise figure (NF) performance of a receiver. For this and other reasons, low noise amplifiers (LNAs) are needed for many communications applications.

The dynamic range of active components such as LNAs is typically defined on the low-output signal side by the noise figure (NF), and on the high-output signal side by intercept points (e.g., the intercept point second order, IP2, and the intercept point third order IP3). Intercepts points indicate how much output level can be achieved before limitations occur due to undesired distortions. An intercept point is actually a fictitious, extrapolated point on an output versus input curve for a given device. Output level limitations may be manifested as nonlinearities in the response of a device, which in turn may appear as harmonics of an input signal.

The implementation of devices such as a digital satellite (e.g., Direct Broadcast Satellite or DBS) direct conversion tuner integrated circuit that does not require a front-end tracking filter requires a wideband, high dynamic range, variable gain amplifier. In such applications, a low NF figure is required when amplifying a satellite signal with maximum gain. Further, when the satellite signal is received at maximum strength, it must be attenuated (sometimes more than 30 dB over the L-band of 950 MHz to 2150 MHz) while introducing very low distortion. While the gain is reduced from its maximum value to its minimum value, the IP3 is preferably variable from −10 dBm to +12 dBm, while peaking at +18 dBm in between these extremes, in order to meet overall IP3 specifications. The RF front end (including the variable gain amplifier and mixer circuitry) may require −12 dBm IP3 at full gain and +12 dBm at full attenuation. In addition, the foregoing specifications must be met over wide process and temperature variations. It is also desirable to provide on-chip matching to the characteristic impedance of an associated antenna.

Many prior integrated LNA designs suffer from a variety of shortcomings, including discontinuous gain curves and relatively poor linearity and noise performance. The need to compensate for such disadvantages increases overall system implementation costs and complexity.

SUMMARY OF THE INVENTION

Briefly, an amplifier circuit according to the present invention provides continuously variable gain, and is suitable for use in a wide range of applications including fully integrated direct-conversion tuner circuits. The amplifier circuit includes a novel degenerated input stage that permits a low Noise Figure and superior linearity to be achieved in combination.

The continuously variable gain functionality is implemented by steering current away from an output load of the amplifier through differential transistor pairs located in the current signal paths of the input stage. In order to achieve high levels of attenuation at high frequency, the amplifier circuit may be implemented differentially. Headroom problems are avoided by placing the attenuation or matching resistors of the degenerated input stage in the signal path, such that there is little or no DC voltage drop across the resistors due to the relatively high bias currents needed to achieve high IP3. Further, this arrangement permits very accurate on-chip matching to an off-clip signal source.

The distribution of IP3 values over the gain range, as well as gain and NF characteristics, are dependent on resistor ratios rather than absolute values. These amplifier characteristics are thus largely temperature and process independent. In one embodiment of the invention, separate voltage supplies, ground connections and bias circuits are provided for different portions of the circuitry in order to improve noise immunity and prevent high frequency input signals from coupling to the differential output of the amplifier.

An amplifier according to the present invention thus lends itself to any application where variable gain and either high sensitivity (low NF) or high linearity (high IP3), or a mix thereof, is required.

BRIEF DESCRIPTION OF THE DRAWINGS

A better understanding of the present invention can be obtained when the following detailed description of an exemplary embodiment is considered in conjunction with the following drawings, in which.

DETAILED DESCRIPTION OF THE INVENTION

Figure 1:
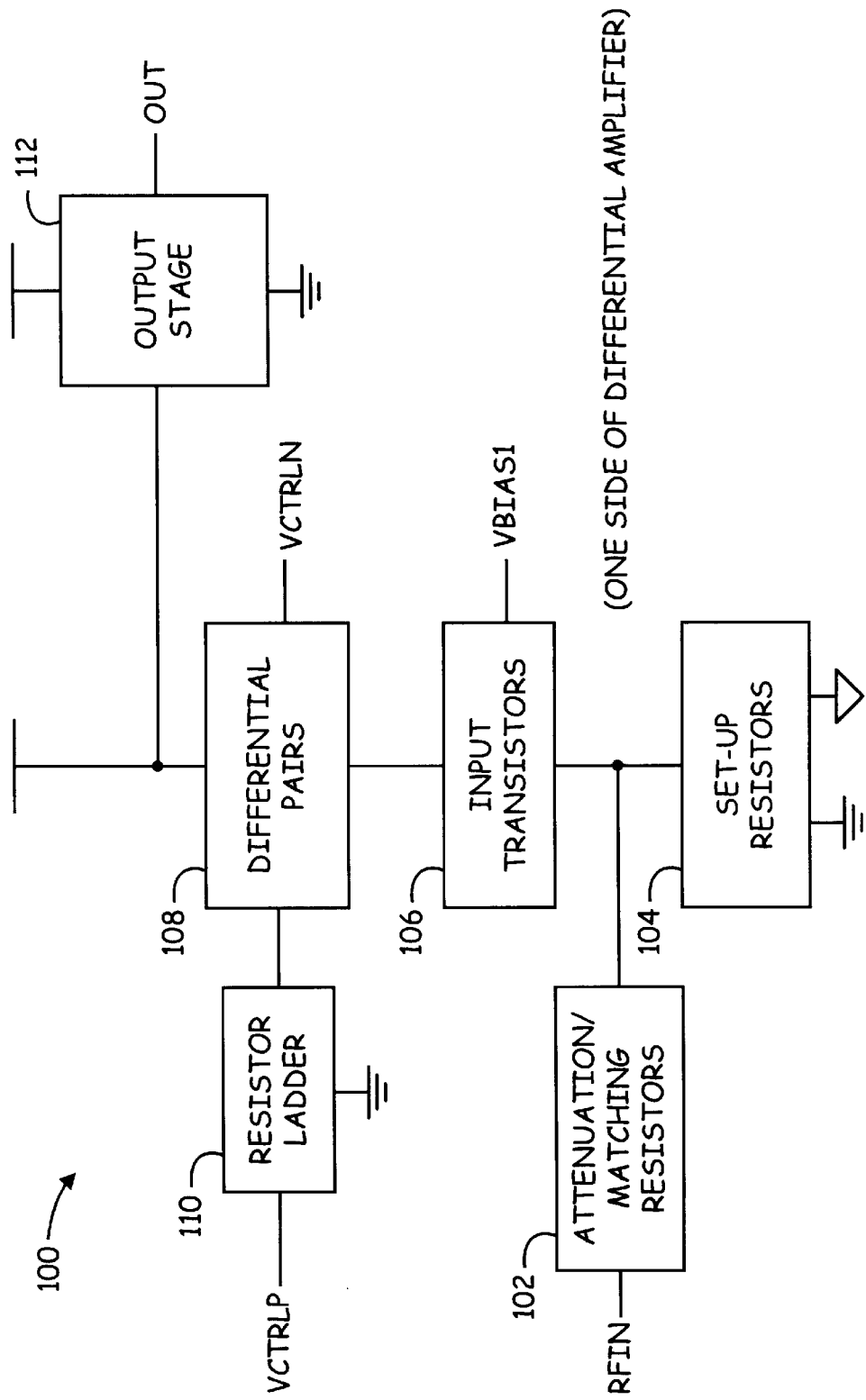
FIG. 1 is a schematic diagram of an exemplary amplifier circuit implemented in accordance with the present invention.

FIG. 1 is a schematic diagram of one side of a differential amplifier 100 implemented in accordance with the present invention. The amplifier 100 includes continuously variable gain, as well as a novel degeneration input stage that permits a low Noise Figure and superior linearity to be achieved in combination.

The amplifier circuit 100 includes a degeneration stage formed of attenuation/matching resistors 102. The attenuation/matching resistors 102 perform a first degeneration of an incoming signal RFIN. The attenuation/matching resistors 102 are preferably arranged in a parallel configuration to permit very accurate on-chip matching to an off-chip signal source. As will be appreciated, the combination of the attenuation/matching resistors 102, input transistors 106 and set-up resistors 104 form an input stage functioning to convert the incoming signal RFIN from a voltage to one or more currents. Headroom problems are avoided by placing the attenuation/matching resistors 102 in the signal path, such that there is little or no DC voltage drop across the resistors due to the relatively high bias currents needed to achieve high IP3.

The continuously variable gain functionality is implemented by steering current away from an output stage 112 through differential transistor pairs 108 stacked on top of the input transistors 106. The input transistors are biased by a first bias voltage VBIAS1, which in combination with the set-up resistors 104 establishes at least one current signal path. Each such current signal path may be independently controlled and optimized (e.g., via the set-up resistors 104) to improve overall linearity and alter the gain of the amplifier 100. In particular, differential control voltages VCTRLP and VCTRLN are provided to control the amount of current that is communicated to the output stage 112.

In the illustrated embodiment, the control voltage VCTRLP is provided to the transistors of one side of the differential pairs 108 via a resistor ladder 110, while the transistors of the opposing sides of the differential pairs 108 are controlled by the control voltage VCTRLN. The resistor ladder 110 functions to determine which current branches are steered to the load and which are steered away for given control voltages VCTRLP and VCTRLP. The resistor ladder 110 also determines how much various currents will overlap and contribute to the output—i.e., for given values of VCTRLP and VCTRLP one current branch may be the main contributor but neighboring current branches may also contribute, resulting in a continuous and smooth attenuation curve. By varying the control voltages VCTRLP and VCTRLN, the contribution of each current signal path to the overall gain of the amplifier 100 may thus be altered.

Further, the values of the set-up resistors 104 may be set such that differing amounts of current flow through the different current signal paths. By choosing appropriate values for these resistors, variance of IP3 over the attenuation curve may be adjusted as desired.

In the disclosed embodiment of the invention, the distribution of IP3 values over the gain range, as well as gain and NF characteristics, are advantageously dependent on resistor ratios rather than absolute values. These amplifier characteristics are thus largely temperature and process independent, as the ratio of resistor values tracks over these variables.

Figure 2:
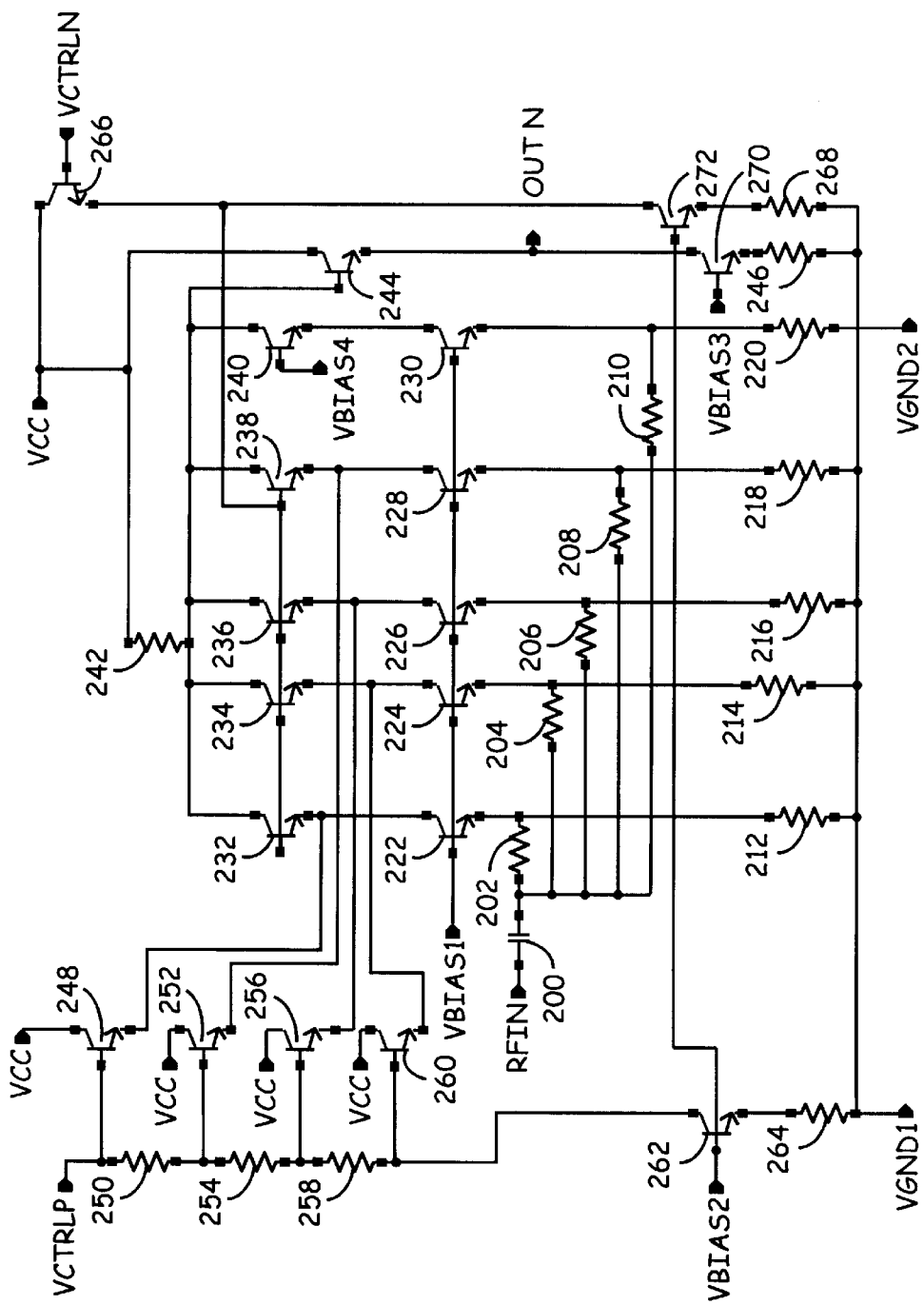
FIG. 2 is a schematic diagram providing exemplary details of the amplifier circuit of FIG. 1.

Although the circuit elements described in conjunction with FIG. 1 and FIG. 2 represent only a single side of a differential amplifier 100 implemented in accordance with the present invention, it will be appreciated by those skill in the art that descriptions are equally applicable to the other side of the amplifier 100. A differential implementation assists in achieving high levels of attenuation at high frequency.

An amplifier 100 implemented in accordance with the present invention is suitable for use in a variety of applications. Such applications include, but are not limited to: wireless LANs and home networking products (such as those compliant with the HomeRF and Bluetooth networking standards), personal communications systems (PCS), code-division multiple-access (CDMA) systems, cellular and cordless phones, hand-held radios, and other systems requiring a broadband I/Q downconversion.

An amplifier 100 according to the present invention is process independent and may be fabricated, for example, in biCMOS, SiGe (silicon germanium)-based biCMOS, silicon-on-insulator (SOI) biCMOS, CMOS, or other suitable process.

FIG. 2 is a schematic diagram providing exemplary details of the amplifier 100 of FIG. 1. An RF input signal RFIN is coupled to one input of the amplifier 100. The RF input signal RFIN is provided to a first plurality of degeneration resistors 202, 204, 206, 208 and 210 via an AC coupling capacitor 200. The parallel combination of resistors 202–210, together with the matching resistors of the other side of the differential amplifier 100, provide a 75-ohm resistive match for the characteristic impedance of an antenna 302 (FIG. 5) in order to maximize power transfer. Alternatively, if different matching requirements are needed to accommodate the different antenna impedances, the values of the resistors 202–210 may be varied accordingly such that the proper equivalent resistance is achieved. As will be appreciated, this configuration obviates the need for external matching components.

The degeneration resistors 202, 204, 206, 208 and 210 function in part to convert the incoming signal RFIN from a voltage to a current. Each of the degeneration resistors 202, 204, 206, 208 and 210 is coupled to the emitter node of an input transistor 222, 224, 226, 228 or 230, respectively, and is part of a current signal path to the output node OUTN (formed by transistors 244 and 270 and resistor 246). In the disclosed embodiment, four of the current signal paths are coupled to the output node OUTN by one side of a differential pair stacked on top of the input transistors 222–228. For example, the current signal path formed by transistor 222 and resistors 202 and 212 is coupled to the output node by transistor 232. In this signal path, current may be steered away from the output node OUTN by a transistor 248, which forms a differential pair with transistor 232. Transistors 234 and 260, transistors 236 and 256, and transistors 238 and 252 form the other three differential pairs of the disclosed amplifier 100. The input transistors 222, 224, 226, 228 and 230 are biased at a common base node by a bias voltage VBIAS1, and are preferably constructed to have a relatively small base resistance (when implemented in a bipolar process).

Currents flowing through the input transistors 222, 224, 226, 228 and 230 are converted to a voltage by a summing resistor 242, which is coupled between the collector nodes of the input transistors 222, 224, 226, 228 and 230 and the supply voltage VCC. The voltage at the common node of the summing resistor 242 and the input transistors 222, 224, 226, 228 and 230 is provided to the output node OUTN via an emitter-follower transistor 244. A transistor 270, biased by a bias voltage VBIAS3, and a resistor 246 complete the output stage.

The control voltage VCTRLN is applied to the base node of each of the transistors 232, 234, 236 and 238 via an emitter follower transistor 266, while the separate control voltage VCTRLP or attenuated version thereof is applied to the base nodes of transistors 248, 252, 256 and 260. In the disclosed embodiment of the invention, the control voltages VCTRLN and VCTRLP correspond to a differential AGC voltage. A remaining current signal path, formed by transistors 230 and 240 and resistors 210 and 220, is separately biased by a bias voltage VBIAS4 as discussed in greater detail below.

The control voltage VCTRLP is applied directly to the base node of transistor 248. A resistor ladder formed of series-connected resistors 250, 254 and 258 provides staggered versions of the control voltage VCTRLP to the transistors 252, 256 and 260. More particularly, the control voltage VCTRLP is provided to the base node of transistor 252 via the resistor 250, and is further provided to the base node of transistor 256 via the series combination of resistors 252 and 256. The series combination of resistors 252, 256 and 260 is used to provide a staggered or attenuated version of the control voltage VCTRLP to the base node of the transistor 260. The resistor ladder is biased by a current source formed of a transistor 262 and a bias resistor 264. The base node of the transistor 262 is driven by a bias voltage VBIAS2. The bias voltage VBIAS2 is also provided to the base node of a transistor 272 which, in conjunction with a bias resistor 268, establishes a bias current used to provide the control voltage VCTRLN to the base nodes of the transistors 232, 234, 236 and 238.

By varying the control voltages VCTRLN and VCTRLP, current may be steered to or away from the output node OUTN. For example, if the value of the control voltage VCTRLP is higher than the control voltage VCTRLN, more current will travel through transistor 248 than through transistor 232, with a corresponding decrease in mirrored current through the output stage. This configuration permits a continuously variable gain through each current signal path, resulting in smooth gain curve (see FIG. 4).

In the disclosed embodiment, each of the degeneration resistors 202, 204, 206, 208 and 210 have different values, resulting in different levels of attenuation of the incoming signal RFIN. The degeneration resistors 202, 204, 206, 208 and 210 of the disclosed embodiment decrease in value, with resistor 202 having the smallest value. The signal path including the relatively smaller value resistor 202 thus produces a relatively high gain, while the gain is incrementally reduced in the remaining signal paths including resistors 204, 206, 208 and 210. All of the signal paths contribute to the overall gain of the amplifier 100 when it is configured to operate at full gain. When no current is steered away, the amplifier 100 of the described embodiment provides approximately 14 dB of gain, although the gain may be adjusted by modifying component values.

In order to correspond to a desired linearity or IP3 specification, the values of the resistors 212, 214, 216, 218 and 220 are set such that an increasing amount of current flows through the respective current signal paths. By choosing different values for these resistors, variance of IP3 over the attenuation curve may be adjusted. It is also noted that the higher the value of the resistor 212, 214, 216, 218 or 220, the less noise is generated in its associated current signal path. However, increasing the values of the resistors 212, 214, 216, 218 and 220 beyond certain values may require increases in the value of the bias voltage VBIAS1 in order to maintain proper biasing, which may in turn lead to headroom problems. The values of the resistors 212, 214, 216, 218 and 220 of the disclosed embodiment of the invention are selected to avoid such problems. In addition, the input transistors 222, 224, 226, 228 and 230 of the disclosed embodiment are sized differently to minimize the impact of noise under high gain modes of operation.

The current signal path formed by transistors 230 and 240 and resistors 210 and 220 is controlled differently than the other current signal paths. The resistor 210 sets the "final" attenuation. When all the other currents are switched away, only the current of this path is provided at the output. In this mode of operation, the amplifier 100 of the disclosed embodiment provides approximately −19 db of gain. The amplifier 100 is capable of operating at frequencies greater than 2 GHZ. At such high frequencies, there may be a large amount of coupling of the input signal RFIN to the output node OUTN resulting in a disruption of phase balance and desired attenuation. For purposes of providing improved isolation and reducing the deleterious effects of signal coupling, the transistor 240 is provided with a separate bias voltage VBIAS4. In addition, the resistor 220 is coupled to a ground node VGND2. The remaining current signal paths are all referenced to a separate ground node VGND1. As will be appreciated, the separate ground nodes VGND1 and VGND2 provide improved isolation and acceptable attenuation at high frequencies. In addition, it is contemplated that more than one current signal path could be provided with a dedicated ground node supply voltage, and/or bias voltage.

The bias voltages VBIAS1, VBIAS2 and VBIAS3 may be generated by standard biasing circuits. For example, it is contemplated that current mirrors operating in conjunction with bandgap voltage references (not shown) may be used to establish the desired voltage levels.

As previously noted, the gain of each current signal path in the amplifier 100 is determined to a large extent by the ratio of resistors, rather than by absolute values. Thus, the gain of the amplifier 100 is largely temperature independent, as the ratio of resistor values tracks over temperature (as well as process) variations.

The amplifier 100 is capable of providing superior specifications at relatively high frequency ranges. In one embodiment, for example, the attenuation range of the amplifier 100 is approximately 30 dB. The gain slope and offset (as a function of the AGC voltage) of the attenuator are digitally programmable and the IP3 versus attenuation curve (e.g., FIG. 3) has different slopes at various attenuation settings to provide optimal gain and IP3 line-up for different symbol rates. In this embodiment, the $S_{11}$ is less than −17B across the relevant signal band. At the highest gain setting (e.g., 17 dB), the NF of the amplifier 100 and an associated mixer is 9 dB and the IP3 is −12 dB. The NF follows a 1 dB-per-dB attenuation slope and saturates at 34 dB at the lowest gain setting with an IP3 of +12 dBm. As will be appreciated, the values and sizes of various portions of the amplifier 100 and associated biasing circuitry may be varied to alter performance characteristics to suit a particular application without departing from the spirit and scope of the invention.

Figure 3:
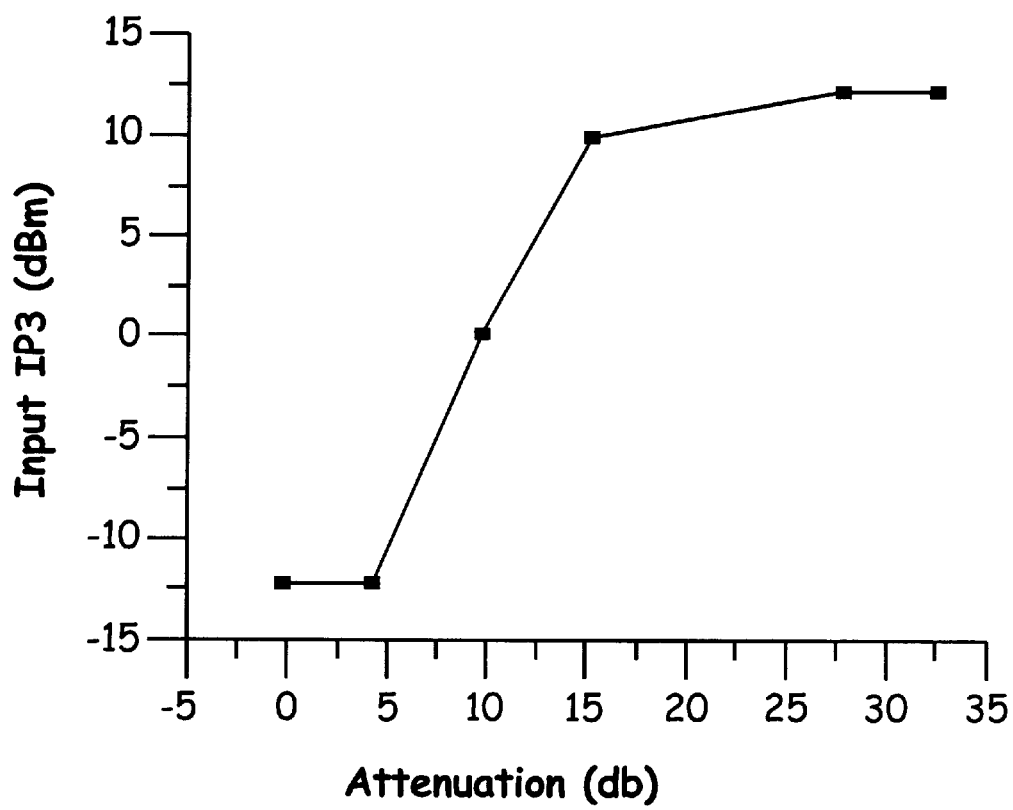
FIG. 3 is a plot of IP3 versus attenuation for an RF front end including an exemplary embodiment of an amplifier according to the present invention.

FIG. 3 is a plot of IP3 versus attenuation for an RF front end including mixer circuitry and an exemplary embodiment of an amplifier 100 according to the present invention. As can be seen, the architecture of the amplifier 100 permits IP3 values to be varied over the attenuation range for purposes of optimizing overall linearity. In particular, each of the aforementioned current signal paths that contribute to the output value of the amplifier 100 may be separately controlled and independently optimized to provide the desired gain settings and intercept characteristics. In the disclosed embodiment, when the gain is reduced from its maximum value to its minimum value, the IP3 is variable from approximately −10 dBm to approximately +12 dBm, while peaking at +18 dBm in between these extremes.

Figure 4:
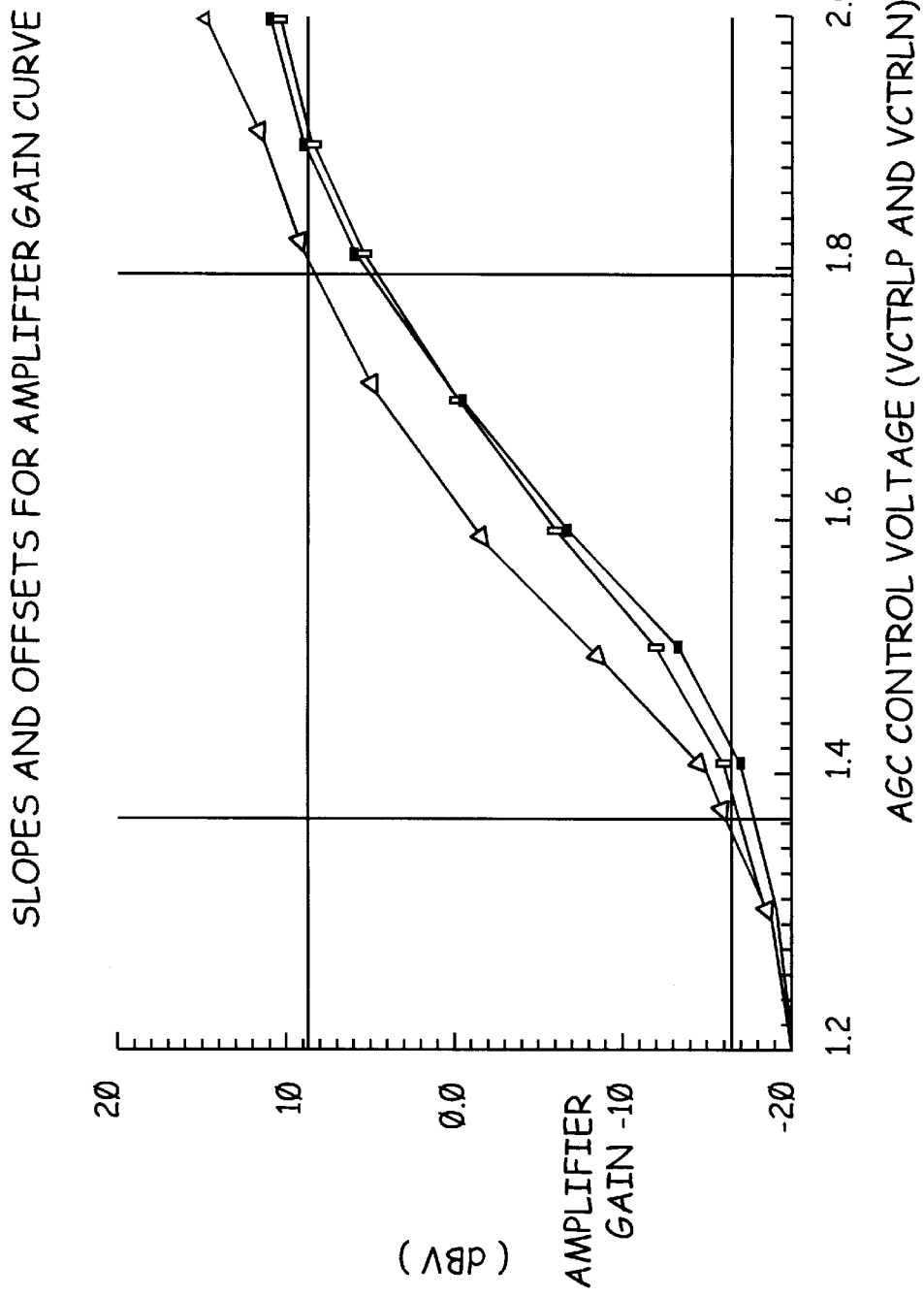
FIG. 4 is a plot of gain versus AGC control voltage for an exemplary embodiment of an amplifier according to the present invention.

FIG. 4 is a plot of gain versus AGC control voltage for an exemplary embodiment of an amplifier 100 according to the present invention. As illustrated, the attenuation range of the amplifier 100 is approximately 30 dB. Gain curves are shown for various values of AGC control voltages VCTLP and VCTRLN. As set forth in greater detail below in conjunction with FIG. 5, the gain slope and offset (as a function of the AGC control voltages VCTLP and VCTRLN) of the amplifier 100 are programmable, such the gain curve can be shifted as illustrated. Although curves are illustrated for only three different slope and offset settings, it will be appreciated that any number of differing curves may be generated via programming.

Figure 5:
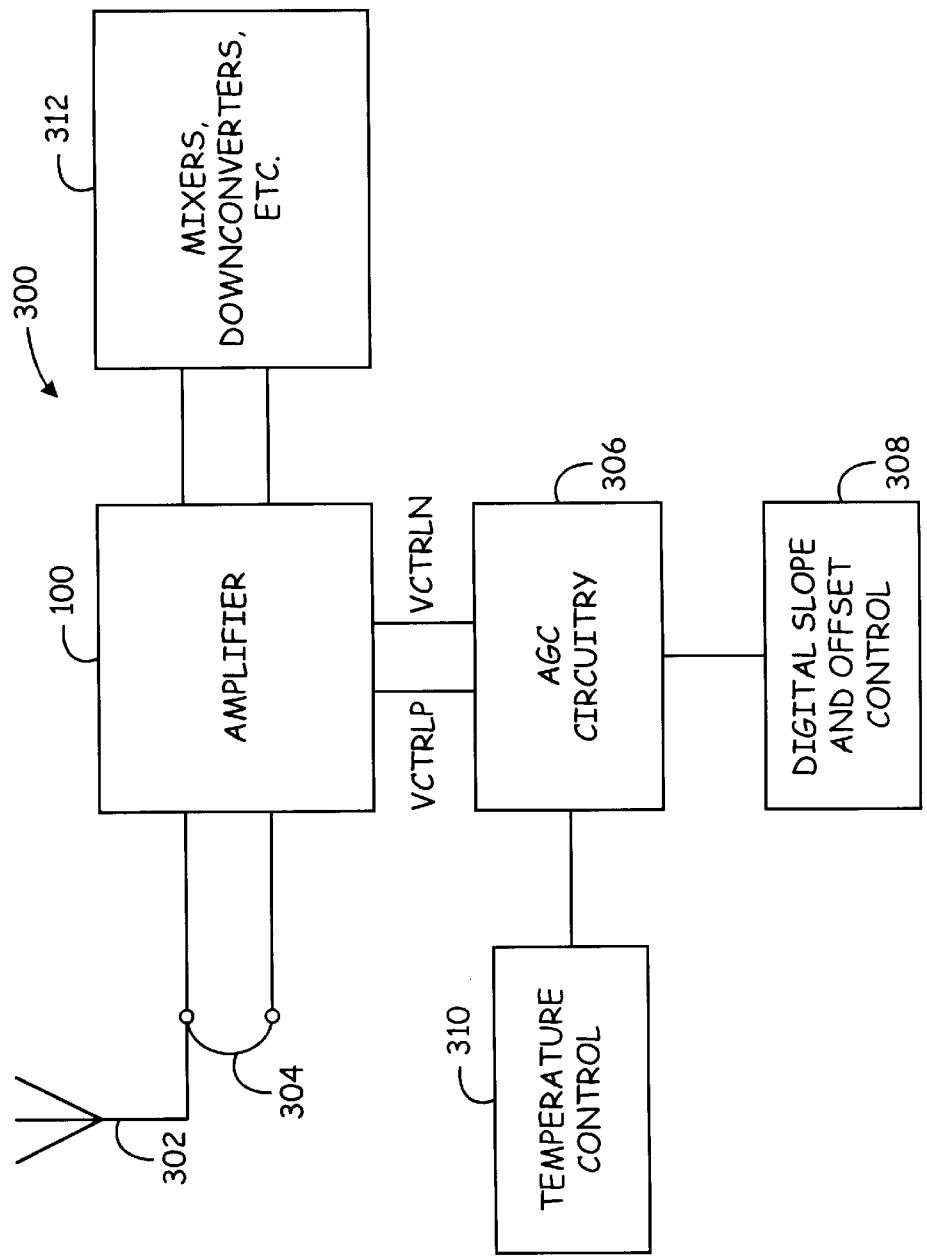
FIG. 5 is a block diagram of exemplary components of direct-conversion receiver utilizing, an amplifier implemented in accordance with the present invention.

FIG. 5 is a block diagram of exemplary components of a single chip direct-conversion receiver 300 utilizing an amplifier 100 implemented in accordance with the present invention. The direct-conversion receiver 300 receives an input signal (e.g., from a low-noise block-down converter (LNB)) via an external antenna 302 and an external balun 304. The balun 304 (or similar device—e.g., a transformer) is used in the disclosed embodiment to generate a differential input signal. The input impedance of the amplifier 100 of the disclosed embodiment is designed to match the characteristic impedance of the associated antenna 302, thus obviating the need for external matching components.

The control voltages VCTRLN and VCTRLP are provided to the amplifier 100 by AGC circuitry 306. The AGC circuitry 306 may receive a control voltage from other system components, such as a baseband integrated circuit in an AGC control loop. In such an arrangement, the AGC circuitry 306 utilizes information from the control loop to generate the control voltages VCTRLN and VCTRLP used to alter the gain of the amplifier 100. As previously noted, it is generally desirable to have a constant signal level at the output of the direct-conversion receiver 300.

Although the control voltages VCTRLN and VCTRLP may be generated in a known manner, the disclosed embodiment of the invention further includes digital slope and offset control circuitry 308 coupled to the AGC circuitry 306. The digital slope and offset control circuitry 308 is capable of varying not only the value of the control voltages VCTRLN and VCTRLP, but also the rate of change of these voltages. In particular, the slope of the gain of the amplifier 100 may be controlled by varying the rate of change of the control voltages VCTRLN and VCTRLP. In addition, the digital slope and offset control circuitry 308 can be programmed to provide different offsets for the control voltages VCTRLN and VCTRLP, with a resulting gain curve such as that illustrated in FIG. 4. Further, temperature control circuitry 310 is coupled to the AGC circuitry 106 for altering the control voltages VCTRLN and VCTRLP as necessary to compensate for changes in ambient operating conditions.

The direct-conversion receiver 300 may also include various mixers (e.g., an I-Q mixer) and downconverters 312, which receive the differential output of the amplifier 100. The output of the mixers feed a baseband section having dynamically controllable gain and bandwidth. In addition, a frequency synthesizer (PLL and VCO) capable of tuning to channels, e.g., in the 950–2150 MHz band using no external filters or varactors is also included in one embodiment of the direct-conversion receiver 300. In summary, a single-chip LNB-to-baseband solution for broadband applications such as DBS may be achieved via the use of an amplifier 300, eliminating the need for external filters or extra power supplies.

Thus, an amplifier architecture suitable for use in fully integrated direct-conversion tuner circuits has been disclosed. The amplifier incorporates a novel degenerated input stage that permits a low Noise Figure and superior linearity to be achieved in combination. The amplifier provides continuously variable gain functionality implemented by steering current away from an output load of the amplifier through differential transistor pairs located in the current signal paths of the input stage. Voltage headroom problems are avoided by placing the attenuation resistors of the degenerated input stage in the signal path, such that there is little or no DC voltage drop across the resistors. Further, this arrangement permits very accurate on-chip matching to an off-chip signal source. The distribution of IP3 values over the gain range of the amplifier, as well as gain and NF characteristics, are dependent on resistor ratios rather than absolute values. An amplifier according to the present invention thus lends itself to any application where variable gain and either high sensitivity (low NF) or high linearity (high IP3), or a mix thereof, is required.

In view of the above detailed description of the present invention and associated drawings, other modifications and variations will now become apparent to those skilled in the art. It should also be apparent that such other modifications and variations may be effected without departing from the spirit and scope of the present invention.

We claim:

1. An amplifier, comprising:
   an input stage configured to convert an incoming signal from a voltage to a plurality of representative currents in a plurality of current signal paths;
   a plurality of differential pairs of devices coupled between the input stage and a main current signal path, one of the differential pairs located in each of the respective current signal paths for controlling the amount of current provided by the respective current signal path to the main current signal path, each device of the differential pairs having a control electrode and first and second conducting electrodes supporting a current therebetween upon application of a sufficient control voltage at the control electrode; and
   an output stage generating an output signal that is dependent on current in the main current signal path;
   wherein the representative currents of the current signal paths differ, and the gain of the amplifier is continuously variable by voltages applied at the control electrodes of the differential pairs.

2. The amplifier of claim 1, the input stage comprising a plurality of degeneration resistors coupled in a parallel between an incoming signal node and the second conducting electrodes of the plurality of differential pairs.

3. The amplifier of claim 2, further comprising a second input stage, a second plurality of differential pairs of devices, and a second output stage arranged differentially with the aforementioned elements of the amplifier.

4. The amplifier of claim 2, wherein the equivalent impedance of the degeneration resistors is configured to be substantially equivalent to the impedance of the source of an incoming signal.

5. The amplifier of claim 2, wherein the plurality of degeneration resistors comprises resistors of differing values.

6. The amplifier of claim 2, the input stage further comprising a plurality of set-up resistors and a plurality of input devices disposed in series in individuals ones of the current signal paths, each of the input devices having a control electrode for receiving a bias voltage, and first and second conducting electrodes supporting current signals therebetween.

7. The amplifier of claim 6, wherein the plurality of differential pairs of devices and the plurality of input devices are bipolar transistors having a base comprising the control electrodes, and a collector and an emitter comprising the first and second conducting electrodes, respectively.

8. The amplifier of claim 7, wherein the output stage comprises an emitter follower circuit.

9. The amplifier of claim 6, wherein the plurality of differential pairs of devices and the plurality of input devices are MOSFETs having a gate comprising the control electrodes, and a drain and source comprising the first and second electrodes.

10. The amplifier of claim 1, wherein the incoming signal is an RF signal.

11. The amplifier of claim 1, further comprising a summing resistor coupled to the first electrodes for summing the currents of the current signal paths.

12. The amplifier of claim 11, wherein the gain of the amplifier is determined largely by the ratios of the set-up resistors, degeneration resistors and summing resistor.

13. The amplifier of claim 1, further comprising separate ground connections for differing ones of the current signal paths.

14. The amplifier of claim 1, wherein at least one of the devices of the differential pairs having a separate bias voltage.

15. A direct-conversion receiver, comprising:
a signal source providing at least one incoming signal;
an amplifier, comprising:
an input stage configured to convert the incoming signal from a voltage to a plurality of representative currents in a plurality of current signal paths, the input stage comprising a plurality of degeneration resistors coupled in a parallel between a common incoming signal node and the current signal paths;
a plurality of differential pairs of devices coupled between the input stage and a main current signal path, one of the differential pairs located in each of the respective current signal paths for controlling the amount of current provided by the respective current signal path to the main current signal path, each device of the differential pairs having a control electrode and first and second conducting electrodes supporting a current therebetween upon application of a sufficient control voltage at the control electrode; and
an output stage generating an output signal that is dependent on current in the main current signal path; and
automatic gain control circuitry for providing control voltages at the control electrodes of the differential pairs to control the gain of the amplifier, the automatic gain control circuitry configurable to continuously vary the rate of change of the control signals.

16. The direct-conversion receiver of claim 15, the automatic control circuitry further configurable to vary offsets between the control voltages.

17. The direct-conversion receiver of claim 15, wherein the at least one incoming signal is a direct broadcast satellite signal.

18. The direct-conversion receiver of claim 15, wherein the equivalent impedance of the degeneration resistors is configured to be substantially equivalent to the impedance of the signal source.

19. The direct-conversion receiver of claim 15, the input stage further comprising a plurality of set-up resistors and a plurality of input devices disposed in series in individuals ones of the current signal paths, each of the input devices having a control electrode for receiving a bias voltage, and first and second conducting electrodes supporting current signals therebetween.

20. The direct-conversion receiver of claim 19, wherein the plurality of differential pairs of devices and the plurality of input devices are bipolar transistors having a base comprising the control electrodes, and a collector and an emitter comprising the first and second conducting electrodes, respectively.

* * * * *